US011440771B2

(12) United States Patent
    Fauconnet

(10) Patent No.: US 11,440,771 B2
(45) Date of Patent: Sep. 13, 2022

(54) SYSTEMS AND METHODS FOR AUTOMATED ELEVATOR COMPONENT INSPECTION

(71) Applicant: Otis Elevator Company, Farmington, CT (US)

(72) Inventor: Aurelien Fauconnet, Isdes (FR)

(73) Assignee: OTIS ELEVATOR COMPANY, Farmington, CT (US)

( * ) Notice: Subject to any disclaimer, the term of this patent is extended or adjusted under 35 U.S.C. 154(b) by 1100 days.

(21) Appl. No.: 16/031,039

(22) Filed: Jul. 10, 2018

(65) Prior Publication Data
    US 2019/0016561 A1    Jan. 17, 2019

(30) Foreign Application Priority Data
    Jul. 11, 2017    (EP) .................................. 17305904

(51) Int. Cl.
    B66B 5/00        (2006.01)
    G01R 21/133      (2006.01)
    (Continued)

(52) U.S. Cl.
    CPC .......... B66B 5/0087 (2013.01); B66B 5/0018 (2013.01); B66B 5/0025 (2013.01);
    (Continued)

(58) Field of Classification Search
    CPC ... B66B 5/0018; B66B 5/0025; B66B 5/0087; B66B 5/02; B66B 9/00; G01R 11/00; G01R 21/133; G01R 21/1336
    See application file for complete search history.

(56) References Cited

U.S. PATENT DOCUMENTS 4,555,689 A * 11/1985 Brick .................... B66B 5/0025
                                                      187/393
4,646,058 A    2/1987 Mandel et al.
            (Continued)

FOREIGN PATENT DOCUMENTS

CN       105016189 A    11/2015
JP         2667276      11/1991
            (Continued)

OTHER PUBLICATIONS

European Search Report, European Application No. 17305904.9, dated Jan. 23, 2018, European Patent Office; 6 pages.

*Primary Examiner* — Quan Zhen Wang
*Assistant Examiner* — Rajsheed O Black-Childress
(74) *Attorney, Agent, or Firm* — Cantor Colburn LLP

(57) ABSTRACT

Methods and systems for automatically checking an operational status of electrical components of an elevator system, the methods including setting a first power state of all addressed electrical components of the elevator system, measuring a control value power consumption with a power consumption counter, switching a first addressed electrical component into a second power state, monitoring a power consumption associated with the first addressed electrical component, comparing the power consumption associated with the first addressed electrical component with the control value power consumption, and when the power consumption associated with the first addressed electrical component is not greater than the control value power consumption, performing a detected failure operation.

15 Claims, 4 Drawing Sheets

(51) Int. Cl.
  *G01R 11/00* (2006.01)
  *B66B 5/02* (2006.01)
  *B66B 9/00* (2006.01)

(52) U.S. Cl.
  CPC ............... *B66B 5/02* (2013.01); *B66B 9/00* (2013.01); *G01R 11/00* (2013.01); *G01R 21/1336* (2013.01); *G01R 21/133* (2013.01)

(56) References Cited

U.S. PATENT DOCUMENTS

| | | | |
|---|---|---|---|
| 4,650,037 | A | 3/1987 | Husson et al. |
| 5,557,546 | A | 9/1996 | Fukai et al. |
| 5,726,399 | A | 3/1998 | Murphy |
| 5,787,020 | A | 7/1998 | Molliere et al. |
| 5,952,627 | A * | 9/1999 | Park .................. B66B 3/00 187/247 |
| 6,543,583 | B1 | 4/2003 | Barreiro et al. |
| 6,604,611 | B2 | 8/2003 | Liu et al. |
| 7,708,118 | B2 | 5/2010 | Tyni et al. |

FOREIGN PATENT DOCUMENTS

| | | |
|---|---|---|
| JP | 04169483 | 6/1992 |
| JP | 05178554 | 7/1993 |
| JP | 10120322 | 5/1998 |
| JP | 10297838 A | 11/1998 |
| JP | 2001171930 | 6/2001 |
| JP | 2011011872 | 1/2011 |
| JP | 4765449 | 9/2011 |
| JP | 4792894 | 10/2011 |
| JP | 2013071795 | 4/2013 |

* cited by examiner

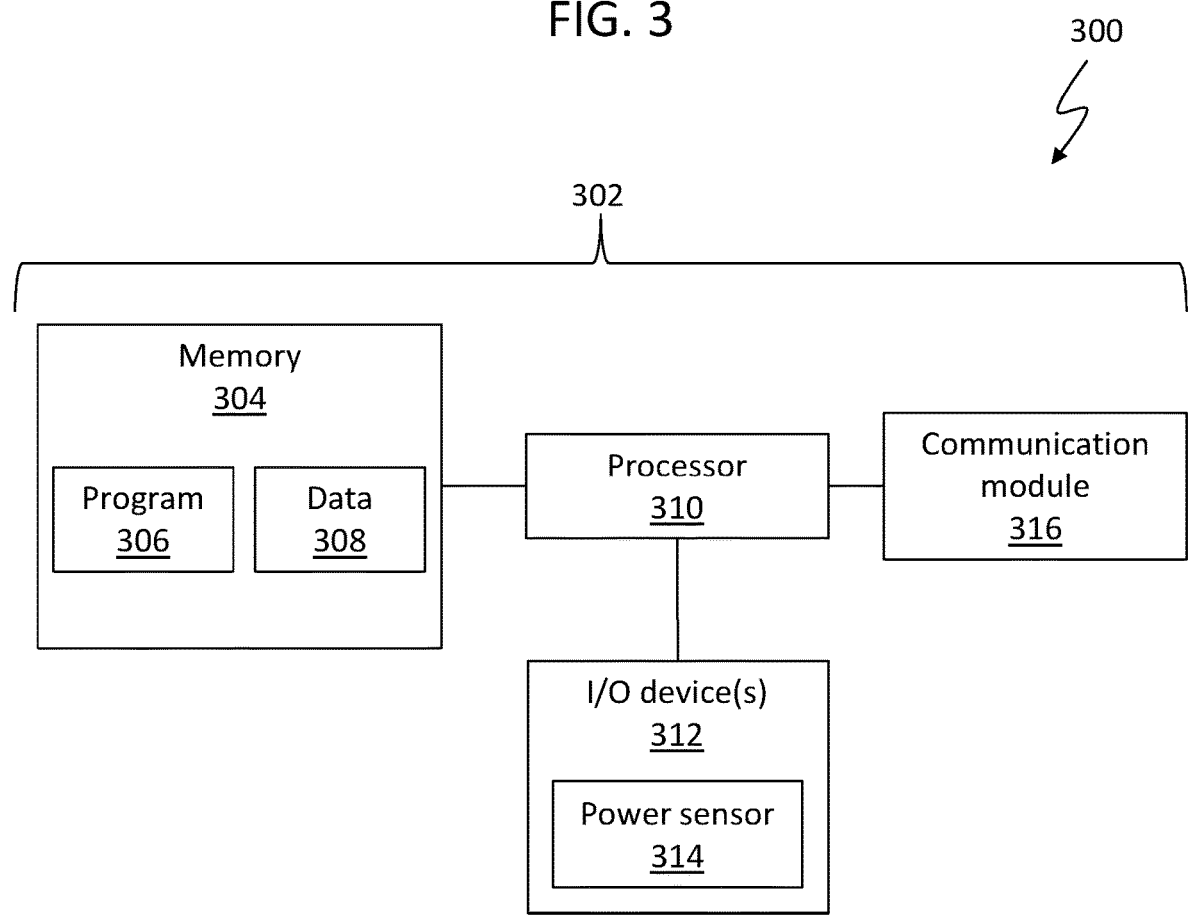

SYSTEMS AND METHODS FOR AUTOMATED ELEVATOR COMPONENT INSPECTION

CROSS REFERENCE TO RELATED APPLICATIONS

This application claims the benefit of European Application No. 17305904.9, filed Jul. 11, 2017, which is incorporated herein by reference in its entirety.

BACKGROUND

The subject matter disclosed herein generally relates to elevator systems and, more particularly, to systems and methods for automated checking of components of elevator systems.

Elevator systems, and particularly elevator cars, include various components that may require inspection to ensure such components are operating and/or functioning properly. The components may be electrical and/or aesthetic features in or on the elevator car, and may require visual inspection by a mechanic. Such visual inspection may have various drawbacks as will be appreciated by those of skill in the art. Accordingly, it may be advantageous to have improved inspection systems and processes for inspecting the components of the elevator system.

SUMMARY

According to some embodiments, methods for automatically checking an operational status of electrical components of an elevator system are provided. The methods include setting a first power state of all addressed electrical components of the elevator system. measuring a control value power consumption with a power consumption counter, switching a first addressed electrical component into a second power state, monitoring a power consumption associated with the first addressed electrical component, comparing the power consumption associated with the first addressed electrical component with the control value power consumption, and when the power consumption associated with the first addressed electrical component is not greater than the control value power consumption, performing a detected failure operation.

In addition to one or more of the features described above, or as an alternative, further embodiments of the methods may include that, when the power consumption associated with the first addressed electrical component is greater than the control value power consumption, switching the first addressed electrical component to the first power state.

In addition to one or more of the features described above, or as an alternative, further embodiments of the methods may include switching a second addressed electrical component into the second power state, monitoring a power consumption associated with the second addressed electrical component, and comparing the power consumption associated with the second addressed electrical component with the control value power consumption.

In addition to one or more of the features described above, or as an alternative, further embodiments of the methods may include that the detected failure operation comprises at least one of (i) storing data associated with the first addressed electrical component or (ii) generating a notification indicating that the first addressed electrical component has failed.

In addition to one or more of the features described above, or as an alternative, further embodiments of the methods may include performing an elevator use check prior to setting the first power state of all addressed electrical components of the elevator system.

In addition to one or more of the features described above, or as an alternative, further embodiments of the methods may include that the addressed electrical components comprise at least one of (i) a button of a car operating panel, (ii) a lighting fixture of an elevator car, or (iii) a display located within the elevator car.

In addition to one or more of the features described above, or as an alternative, further embodiments of the methods may include that first power state is an off-state of the addressed electrical components and the second power state is an on-state of the addressed electrical components.

In addition to one or more of the features described above, or as an alternative, further embodiments of the methods may include that the addressed electrical components further comprise at least one of (i) a button of a hall or car call panel, or (ii) a display located inside the elevator car at a landing of the elevator system.

In addition to one or more of the features described above, or as an alternative, further embodiments of the methods may include that the method is triggered by at least one of (i) a timer, (ii) a predetermined schedule, (iii) a request from a user device, or (iv) a predetermined event.

According to some embodiments, elevator systems are provided. The elevator systems include an elevator car located within an elevator shaft and a controller for automatically checking an operational status of electrical components of the elevator system. The controller is configured to execute instructions including setting a first power state of all addressed electrical components of the elevator system, measuring a control value power consumption with a power consumption counter, switching a first addressed electrical component into a second power state, monitoring a power consumption associated with the first addressed electrical component, comparing the power consumption associated with the first addressed electrical component with the control value power consumption, and when the power consumption associated with the first addressed electrical component is not greater than the control value power consumption, performing a detected failure operation.

In addition to one or more of the features described above, or as an alternative, further embodiments of the elevator systems may include that the instructions further include, when the power consumption associated with the first addressed electrical component is greater than the control value power consumption, switching the first addressed electrical component to the first power state.

In addition to one or more of the features described above, or as an alternative, further embodiments of the elevator systems may include that the instructions further include switching a second addressed electrical component into the second power state, monitoring a power consumption associated with the second addressed electrical component, and comparing the power consumption associated with the second addressed electrical component with the control value power consumption.

In addition to one or more of the features described above, or as an alternative, further embodiments of the elevator systems may include that the detected failure operation comprises at least one of (i) storing data associated with the first addressed electrical component or (ii) generating a notification indicating that the first addressed electrical component has failed.

In addition to one or more of the features described above, or as an alternative, further embodiments of the elevator systems may include that the addressed electrical components comprise at least one of (i) a button of a hall or car call panel, or (ii) a display located inside the elevator car at a landing of the elevator system.

In addition to one or more of the features described above, or as an alternative, further embodiments of the elevator systems may include that the power consumption counter is operably connected to a power wire of the elevator system.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The subject matter is particularly pointed out and distinctly claimed at the conclusion of the specification. The foregoing and other features, and advantages of the present disclosure are apparent from the following detailed description taken in conjunction with the accompanying drawings in which:

FIG. 3 is a schematic block diagram illustration of an example computing system representing a controller of an elevator system of the present disclosure.

DETAILED DESCRIPTION

Figure 1:
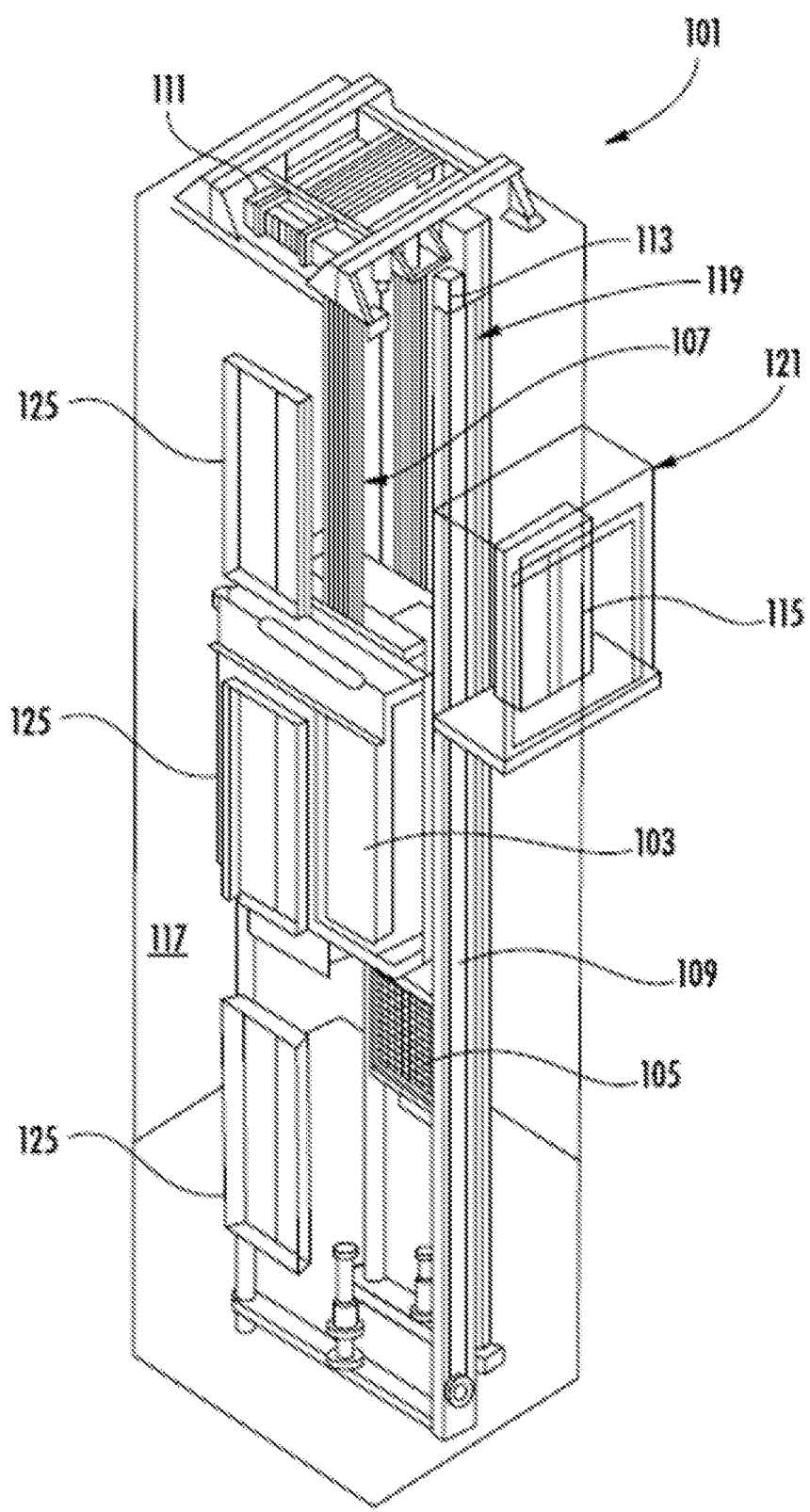
FIG. 1 is a schematic illustration of an elevator system that may employ various embodiments of the present disclosure.

FIG. 1 is a schematic illustration of an elevator system that may employ various embodiments of the present disclosure. FIG. 1 is a perspective view of an elevator system 101 including an elevator car 103, a counterweight 105, a roping 107, a guide rail 109, a machine 111, a position encoder 113, and a controller 115. The elevator car 103 and counterweight 105 are connected to each other by the roping 107. The roping 107 may include or be configured as, for example, ropes, steel cables, and/or coated-steel belts. The counterweight 105 is configured to balance a load of the elevator car 103 and is configured to facilitate movement of the elevator car 103 concurrently and in an opposite direction with respect to the counterweight 105 within an elevator shaft 117 and along the guide rail 109.

The roping 107 engages the machine 111, which is part of an overhead structure of the elevator system 101. The machine 111 is configured to control movement between the elevator car 103 and the counterweight 105. The position encoder 113 may be mounted on an upper sheave of a speed-governor system 119 and may be configured to provide position signals related to a position of the elevator car 103 within the elevator shaft 117. In other embodiments, the position encoder 113 may be directly mounted to a moving component of the machine 111, or may be located in other positions and/or configurations as known in the art.

The controller 115 is located, as shown, in a controller room 121 of the elevator shaft 117 and is configured to control the operation of the elevator system 101, and particularly the elevator car 103. For example, the controller 115 may provide drive signals to the machine 111 to control the acceleration, deceleration, leveling, stopping, etc. of the elevator car 103. The controller 115 may also be configured to receive position signals from the position encoder 113. When moving up or down within the elevator shaft 117 along guide rail 109, the elevator car 103 may stop at one or more landings 125 as controlled by the controller 115. Although shown in a controller room 121, those of skill in the art will appreciate that the controller 115 can be located and/or configured in other locations or positions within the elevator system 101.

The machine 111 may include a motor or similar driving mechanism. In accordance with embodiments of the disclosure, the machine 111 is configured to include an electrically driven motor. The power supply for the motor may be any power source, including a power grid, which, in combination with other components, is supplied to the motor.

Although shown and described with a roping system, elevator systems that employ other methods and mechanisms of moving an elevator car within an elevator shaft may employ embodiments of the present disclosure. FIG. 1 is merely a non-limiting example presented for illustrative and explanatory purposes.

Figure 2B:
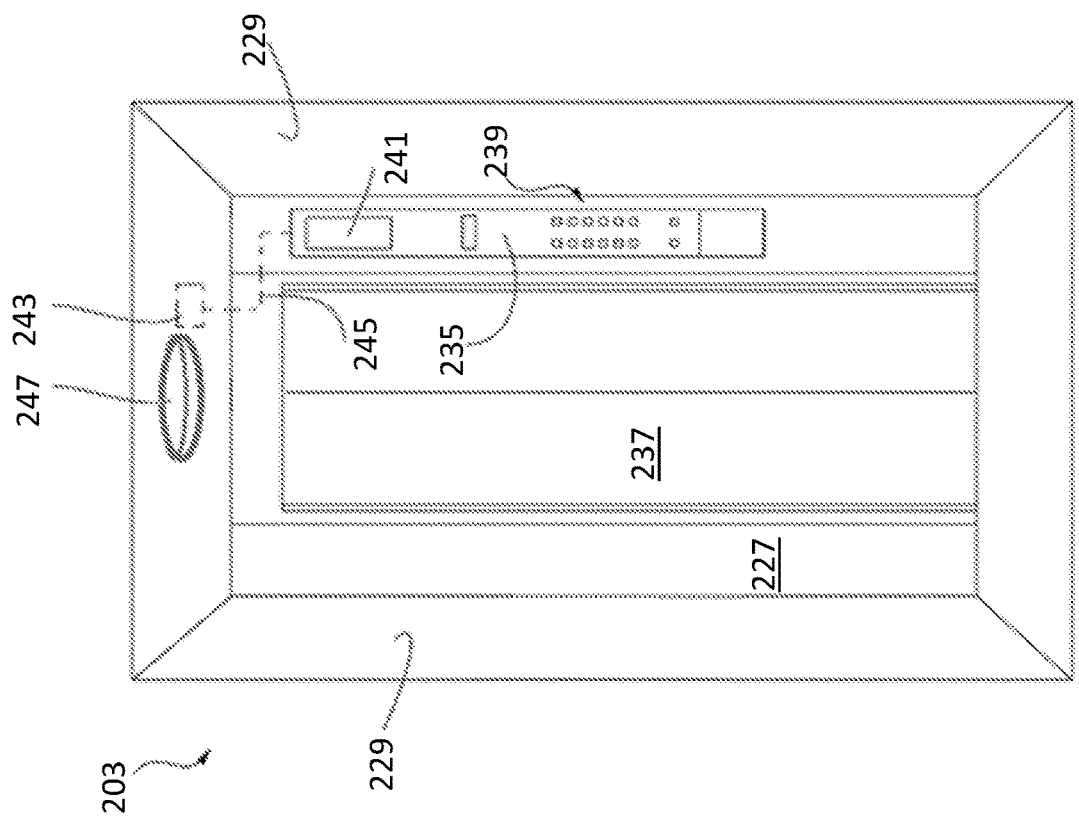
FIG. 2B is a schematic illustration of an interior of the elevator car of FIG. 2A.
Figure 2A:
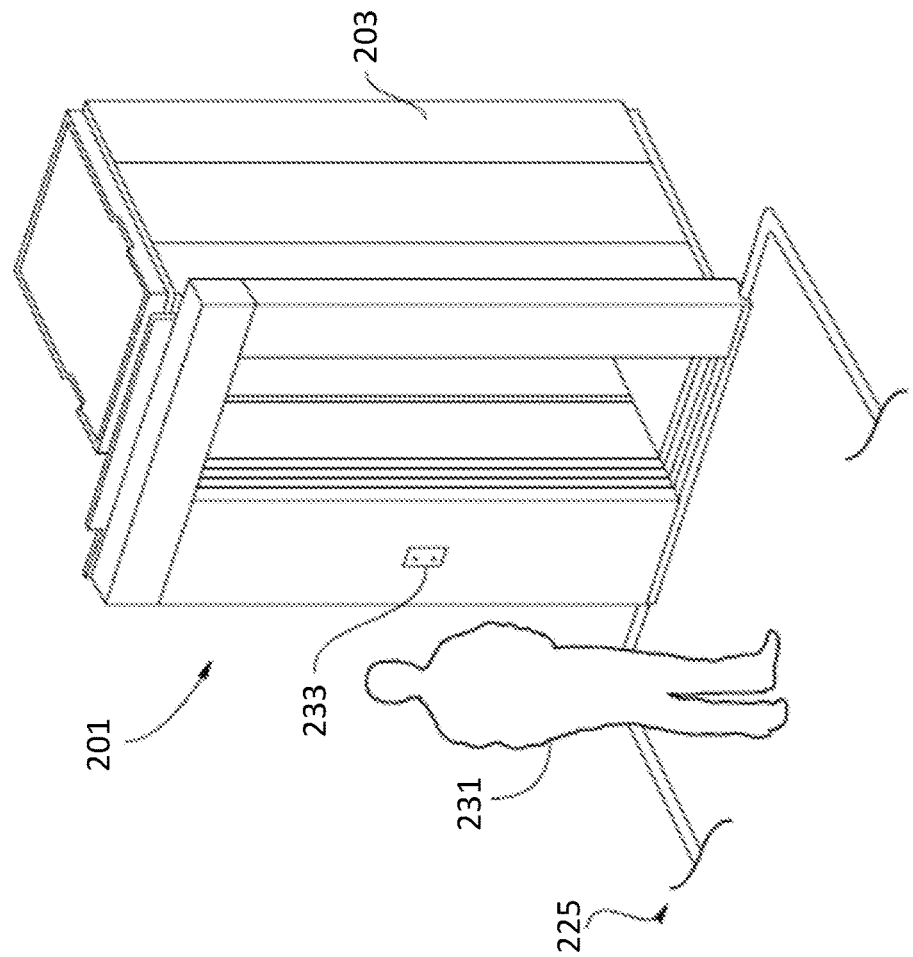
FIG. 2A is a schematic illustration of an elevator system having an elevator car that may incorporate features of the present disclosure.

Turning to FIGS. 2A-2B, schematic illustrations of an elevator system 201 having an elevator car 203 with elevator car panels 227, 229 that can employ embodiments described herein are shown. FIG. 2A is a schematic illustration of the elevator system 201 and elevator car 203 as viewed from a landing 225. FIG. 2B illustrates an interior of the elevator car 203. As illustratively shown, a passenger 231 may call the elevator car 203 using a hall call panel 233 that is located on a wall or panel at the landing 225. The hall call panel 233 is an electro-mechanical operating panel that can include buttons, touch-sensors, key pads, locks, displays, etc. as will be appreciated by those of skill in the art. The hall call panel 233 is operably connected and/or in communication with an elevator controller (e.g., elevator controller 115 shown in FIG. 1) to enable elevator car requests.

Upon arrival of the elevator car 203 at the landing 225, the passenger 231 may enter the elevator car 203 and use a car operating panel 235 to select a desired destination floor. Elevator cars typically include one or maybe two car operating panels 235 depending on the configuration of the elevator car 203. For example, as shown in FIG. 2B, the first elevator car panel 227 may represent a portion of the elevator car 203 that is next to or contains an elevator car door 237. As shown, the car operating panel 235 is located on the other of the elevator car door 237 and on the first elevator car panel 227. In some embodiments, the second elevator car panel 229, which does not include an elevator car door, can include a car operating panel, as will be appreciated by those of skill in the art.

As shown in FIG. 2B, the car operating panel 235 is an electro-mechanical operating panel that can include buttons, touch-sensors, key pads, locks, displays, etc. as will be appreciated by those of skill in the art. For example, as shown, the car operating panel 235 includes operating buttons 239 and a display 241. The operating buttons 239 are used to make requests for action by the elevator system, such as traveling to a desired floor, making emergency calls, opening/closing the elevator car door 237, etc. The display 241 can be a simple numerical indicator that is arranged to provide information to current passengers, may be more versatile and provide additional information such as weather, time, news, etc., or may be interactive, such as a touch screen.

The car operating panel 235 (and the components thereof) is operably connected to a controller 243. The controller 243 may be mounted on the elevator car 203 or may be located elsewhere as part of the elevator system 201. In some embodiments, the controller 243 is part of an elevator controller (e.g., elevator controller 115 shown in FIG. 1). The controller 243 is operably connected to the car operating panel 235 by a connection 245 which can provide power and communication capabilities between the controller 243 and the car operating panel 235.

The elevator car 203 also includes various other electrical features, including lighting 247. The lighting 247 can be located in the ceiling of the elevator car 203, as shown, and/or can be located in various other locations within the elevator car 203. For example, the lighting 247 can include handrail lighting, lighting for the car operating panel 235, and/or other lighting within the elevator car 203, as will be appreciated by those of skill in the art. The lighting 247 can be electrically connected to the controller 243 by a portion of the connection 245 that enables power and/or communication capabilities therebetween.

Current elevator systems require regular maintenance to ensure proper operation and passenger satisfaction. Several levels of maintenance exist, with each typically requiring a mechanic or other inspector to visually and/or physically inspect various aspects of the elevator system. For example, a monthly inspection can include inspection and verification of some components (e.g., functionality of buttons and/or indicators of a car operating panel, check for abnormal vibration or noise, etc.). Another level of maintenance can include more substantial inspections and/or maintenance operations, such as lubrication/grease checks, electrical wiring checks, etc. Various aspects of these maintenance inspections are typically carried out through visual inspection. Such inspections can be time consuming or subject to various other factors (e.g., overlooking or missing a non-functioning or partially functioning component). Accordingly, improved checking and inspection of various aspects of an elevator system may be advantageous. For example, systems for automatically checking the operational status of electrical components of the elevator system (e.g., car operating panel, lighting, displays, etc.) may be desirable.

As provided herein, embodiments of the present disclosure are related to automatic checks or inspections of a set of electrical components (e.g., aesthetic features including lighting, car operating panel, hall call panel, displays, etc.). A specific routine operation is programmed to be performed at predetermined times or intervals, upon specific request, and/or upon a predetermined event occurring. For example, the automated check can be performed nightly or at a specific predetermined time when use and/or traffic within the elevator system is low. A controller, such as elevator controller 115 shown in FIG. 1, can perform a routine or process that cycles through each individual electrical component (e.g., each light, each button, each display, etc.). That is, a software program in conjunction with the controller can turn on, one by one, each electrical component and monitor a power consumption of the elevator system to determine if the specific electrical component is properly functioning or not.

For example, in one non-limiting example, if a monitored power consumption goes up when a particular electrical component is turned on, then it can be assumed that the respective electrical component is working. However, if the monitored power consumption does not change when an electrical device is instructed to be turned on, then it can be assumed that the respective electrical component is not working properly. Such failure of a component can trigger the generation and transmission of a message to request service (either generally or including specific electrical component information).

Referring now to FIG. 3, a schematic block diagram illustration of an example computing system 302 representing a controller 300 of an elevator system of the present disclosure is shown. The computing system 302 may be representative of computing elements or components of elevator controllers as employed in embodiments of the present disclosure. The computing system 302 may be representative of computing elements or components of controllers, networked system elements, computers, etc. For example, the computing system 302 can be configured as part of an elevator controller or a controller mounted on an elevator car. The computing system 302 can be configured to operate one or more electrical components of an elevator system, including, but not limited to car operating panels, hall call panels, buttons, lighting, displays, etc.

As shown, the computing system 302 includes a memory 304 which may store executable instructions and/or data associated with embodiments of the present disclosure. The executable instructions may be stored or organized in any manner and at any level of abstraction, such as in connection with one or more applications, apps, programs, processes, routines, procedures, methods, etc. As an example, at least a portion of the instructions are shown in FIG. 3 as being associated with one or more programs 306. The memory 304 can include RAM and/or ROM and can store one or more programs 306 thereon, wherein the program(s) 306 may be an elevator operating system and/or elevator operating application to be used on an elevator system or components thereof.

Further, the memory 304 may store data 308. The data 308 may include profile or registration data (e.g., associated with the elevator system and components thereof), control routine logic, or any other type(s) of data. The executable instructions stored in the memory 304 may be executed by one or more processors, such as a processor 310, which may be a computer processor in the computing system 302. The processor 310 may be operative on the data 308 and/or configured to execute the program 306. In some embodiments, the executable instructions can be performed using a combination of the processor 310 and remote resources (e.g., data and/or programs stored in the cloud (e.g., remote servers)).

The processor 310 may be coupled to one or more input/output (I/O) devices 312. In some embodiments, the I/O device(s) 312 may include one or more of a physical keyboard or keypad, a touchscreen or touch panel, a display screen, a microphone, a speaker, a mouse, a button, etc. As shown the I/O devices 312 can include a power consumption sensor 314 that is electrically connected to a connection and/or communication connection (e.g., connection 245 shown in FIG. 2B) and arranged to detect power consumption therefrom. In some embodiments, the power consumption sensor can be located at a power input portion of a building or system, e.g., where electrical grid supplies power to the building and/or elevator system. Further, in some embodiments, the power consumption sensor can be located between a grid source and a controller (e.g., controller 115 shown in FIG. 1). The processor 310 can receive detected power data from the power consumption sensor 314. In some embodiments the power consumption sensor 314 may be a power consumption counter.

The components of the computing system 302 may be operably and/or communicably connected by one or more buses. The computing system 302 may further include other features or components as known in the art. For example, the computing system 302 may include one or more communication modules 316, e.g., transceivers and/or devices configured to receive information or data from sources external to the computing system 302. In one non-limiting embodiment, the communication module 316 of the computing system 302 can include a near-field communication chip (e.g., Bluetooth®, Wi-Fi, GSM Gateway, etc.) and a cellular data chip, as known in the art. In some embodiments, the computing system 302 may be configured to receive information over a network (wired or wireless), such as through a wired or wireless network. The information received over the network may be stored in the memory 304 (e.g., as data 308) and/or may be processed and/or employed by one or more programs or applications (e.g., program 306). For example, the computing system 302 may receive instructions and/or commands from remote devices (e.g., mechanic's computer or smartphone) to perform a routine or process that is stored in the memory 304. The computing systems 302 may be used to execute or perform embodiments and/or processes described herein.

Figure 4:
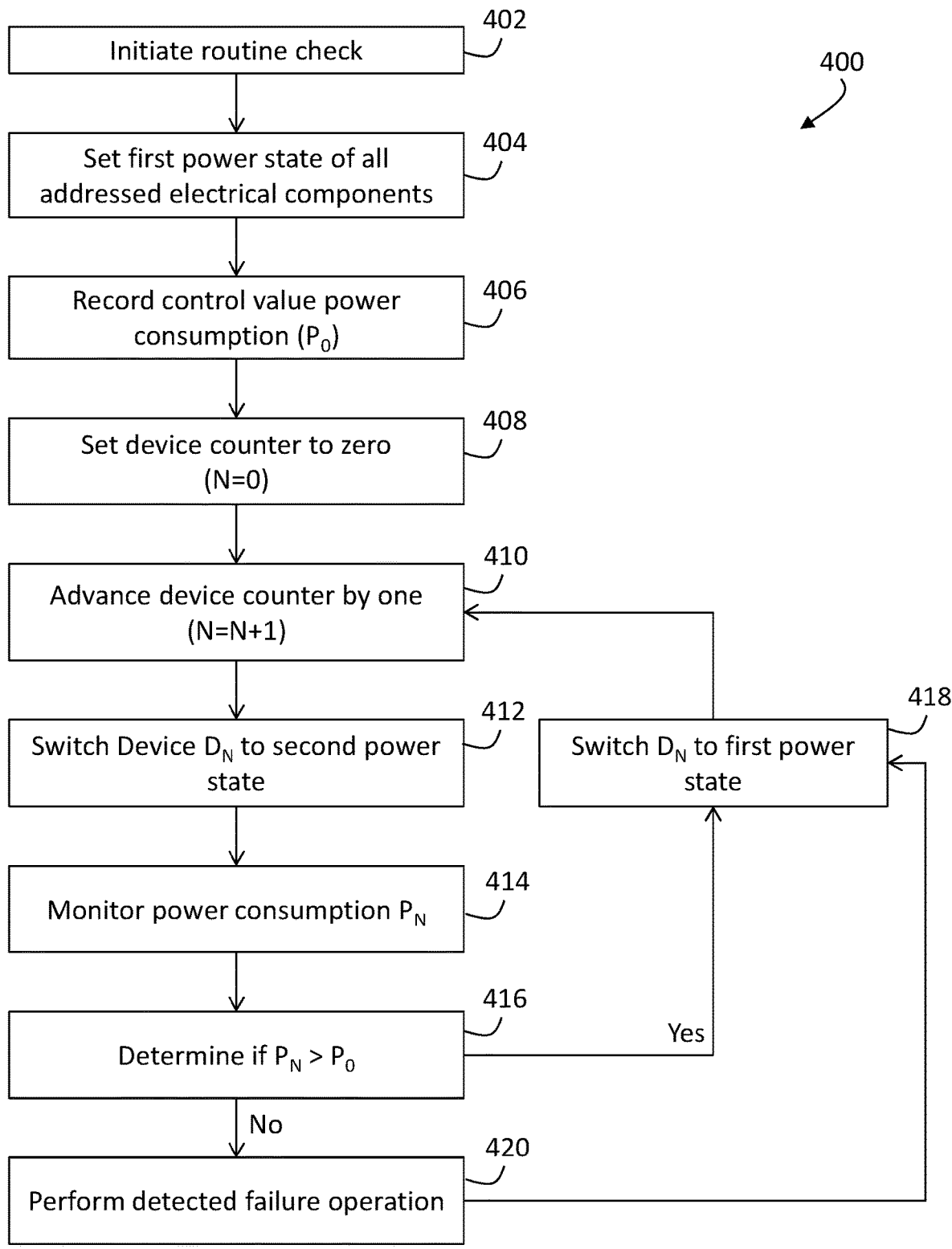
FIG. 4 is a flow process for performing an automated electrical component check within an elevator system in accordance with the present disclosure.

Turning now to FIG. 4, a flow process 400 for performing an automated electrical component check within an elevator system in accordance with the present disclosure is shown. The flow process may be employed in elevator systems as shown and described above, and may be performed using a controller or computing system as shown and described above. In one non-limiting embodiment, a control unit has a software routine (e.g., flow process 400) stored thereon, with the control unit in operable communication with one or more electrical components and a power consumption counter or sensor. Various arrangements are possible without departing from the scope of the present disclosure. For example, in some embodiments, the power consumption sensor is operably connected to a traveling power wire of an elevator car, and in such embodiments the electrical components to be monitored by the controller are on and/or in the elevator car. In other embodiments, the power consumption sensor is operably connected to a power line that supplies power to all electrical features of an elevator system, both on or in an elevator car and also electrical components located at landings of the elevator system.

At block 402, a routine or automated check of elevator components (devices $D_N$) is initiated. In some embodiments, initiation may be triggered by a timer, such as at a specific time and/or date (e.g., in overnight hours when no passengers will be using the elevator system). In some embodiments, flow process 400 can be initiated at block 402 by a request received from a mechanic. The request can be sent from the mechanic using a user device (e.g., computer, laptop, electronic tablet, smart phone, etc.) that is sent to a controller that can execute and/or perform flow process 400. In some embodiments, for example, the user device can be located on-site (e.g., within a maintenance cabinet of the elevator system) while in other embodiments, for example, the user device can be located off-site (e.g., at a workplace of a mechanic or a dispatch location for maintenance requests). In some embodiments, the flow process 400 can be initiated at block 402 by a specific predetermined event, such as a power outage, power surge, or other event or condition. In some embodiments, various different types of triggers can be programmed into the system such that a regular operation is performed but also performed upon request and/or a triggering event.

Once initiated, at block 404, the controller will set a first power state of all of the electrical components that will be checked (referred to herein as "addressed electrical component(s)"). The first power state, as used herein, for example can be powering off all addressed electrical components or can be supplying power to all addressed electrical components. In the embodiment shown in FIG. 4, flow process 400 employs using a first power state of "OFF," although in other embodiments of the present disclosure, the first power state set at block 404 can be an "ON" state. Each electrical component to be checked is addressable by the controller to control a power supply to the specific electrical component individually or independently. The addressed electrical components are components or parts of an electrical system of an elevator system, including, but not limited to, lighting within an elevator car, car operating panel parts (e.g., buttons), hall call panel parts (e.g., buttons), displays located within an elevator car and/or at a landing, etc. In some embodiments, the addressed electrical components are aesthetic features of the elevator system that require and/or consume electrical power for operation and/or functionality.

With the first power state set for all addressed electrical components (e.g., "off"), at block 406, the controller will monitor and record a control value power consumption $P_0$. This is a value of power consumption of the elevator system with none of the addressed electrical components receiving power. The measurement of the control value power consumption $P_0$ can be obtained using a power consumption counter or other similar device. The power consumption counter can be operably connected to a power line that is connected to each/all of the addressed electrical components, and thus a monitoring of power consumption of the system can be achieved.

At block 408, a device counter will be set to zero (N=0). Each addressed electrical component is addressable by a number or other identifier such that the controller of the system can control power supply to each individual addressed electrical component. As such, each addressed electrical component can be assigned an identifier value (e.g., number). As used herein a first addressed electrical component has an identifier value of "N=1," a second addressed electrical component has an identifier value of "N=2," and so on.

At block 410, the device counter is advanced by one (N=N+1).

At block 412, the controller switches the addressed electrical component $D_N$ into a second power state, such as an on-state, and thus supplies electrical power thereto. In other embodiments, the second power state can be an off-state of the addressed electrical component $D_N$.

At block 414, the controller and power consumption counter are used to monitor a power consumption $P_N$ associated with the addressed electrical component $D_N$.

At block 416, the controller will determine if the power consumption $P_N$ of the addressed electrical component $D_N$ is greater than the control value power consumption $P_0$ (is $P_N > P_0$?).

If, at block 416, it is determined that the power consumption $P_N$ of the addressed electrical component $D_N$ is greater than the control value power consumption $P_0$ ($P_N > P_0$), the flow process 400 continues to block 418. The determination that the power consumption $P_N$ of the addressed electrical component $D_N$ is greater than the control value power consumption $P_0$ means that the amount of total power being consumed by the elevator system has increased, indicating that the addressed electrical component $D_N$ is consuming power, and thus is functioning properly.

At block 418, the controller will switch the addressed electrical component $D_N$ to the first power state, such as ceasing power supply to the addressed electrical component $D_N$.

With the addressed electrical component $D_N$ switched back to the first power state, the flow process returns to block 410, and the device counter is advanced by one (N=N+1). Stated another way, the next addressed electrical component $D_{N+1}$ is selected and blocks 412-416 are repeated. Such process may be performed for each electrical component $D_N$ and when every electrical component has been checked, the flow process 400 may end. In some embodiments, after all electrical components are checked, an optional message or notification can be transmitted to indicate that all electrical components are functioning properly.

However, if at block 416 it is determined that the power consumption $P_N$ of the addressed electrical component $D_N$ is equal to the control value power consumption $P_0$ ($P_N=P_0$), the flow process will continue to block 420. If there is no change in the power consumption when an addressed electrical component is activated into the on-state, then it is assumed that the addressed electrical component is not functioning properly (e.g., not drawing any power when it should be drawing power).

At block 420, a detected failure operation is performed. The detected failure operation can be the generation of a message that is transmitted to a remote device to indicate or request service to be performed. The message can, optionally, include information regarding the addressed electrical component that prompted the detected failure operation. In some embodiments, the detected failure operation includes a recording of data associated with the failure or non-functionality of the addressed electrical component. After the detected failure operation is performed at block 420, the flow process 400 can continue to block 418 (switching the addressed electrical component $D_N$ to the off-state (even if non-functional)) and then perform the loop of blocked 410-416 (and block 418 or 420/418 depending on the results of block 416).

The flow process 400 can be repeated based on a schedule and/or based on other triggering events as described above. Thus the flow process can be repeated any number of times to provide automated checks on electrical components of elevator systems.

In some non-limiting embodiments, an optional elevator use check can be performed before block 402 of flow process 400. The elevator use check can involve determining if any hall call panels and/or buttons within an elevator car are activated, which may indicate a call request by a passenger. Further, the elevator use check may include communication with load/weight sensors and/or optical sensors within an elevator car that may be arranged to determine if there are any passengers within the elevator car.

In some embodiments, block 416 of flow process 400 can include additional routines or comparison operations. For example, each addressed electrical component can have a known power consumption $P_K$. In addition to (or alternatively), the flow process 400 at block 416 can compare the monitored power consumption $P_N$ to the known power consumption $P_K$ of the specific or particular addressed electrical component or some other predetermined power consumption (e.g., less than the known power consumption $P_K$ but greater than zero). For example, an LED bar light (comprising a plurality of LED lights) may draw a specific power when all LEDs are operational, and no power when none of the LEDs are operational. However, if the power draw is between the known power consumption $P_K$ and zero, it can be determined that some of the LEDs are not working, but other are still functional. Such measurement can be configured against a minimum allowed amount of non-functional LEDs. As such, in some embodiments, even though some portion of an addressed electrical component is non-functional, it may not be required to perform a maintenance operation immediately. Thus, in some such embodiments, the monitored power consumption $P_N$ may be compared against the known power consumption $P_K$ and a threshold reduction or deviation can be required to trigger the detected failure operation of block 420 of flow process 400.

Further, in some embodiments, the flow process 400 can be interrupted or paused by a predetermined action. For example, once the flow process 400 is initiated at block 402, if a hall call button is active (e.g., a call request is made) the flow process 400 can stop, halt, and/or pause. In some such configurations, the flow process 400 can resume after the call request is completed (e.g., movement of passengers between landings). The resumed flow process 400 may resume at the last device counter value. In some embodiments, even with starting at the last-used device counter value, blocks 404-406 may be repeated to obtain a new control value power consumption $P_0$.

Although flow process 400 is described with respect to turning off all electrical components that will be checked (i.e., addressed electrical component(s)), such as described with respect to block 404, those of skill in the art will appreciate that other flow processes are possible without departing from the scope of the present disclosure. For example, in some embodiments, rather than shutting off all addressed electrical components and then supplying power to each addressed electrical component in turn, the opposite may be employed. For example, power can be supplied to all addressed electrical components of the system, and then power can be turned off for each addressed electrical component and power consumption can be monitored.

Advantageously, embodiments of the present disclosure enable automated checks of the operation and/or functionality of electrical components of elevator systems. That is, advantageously, electrical components checks (e.g., of aesthetic elevator features) can be made more robust through electrical observation rather than the typical visual inspection. Further, embodiments provided herein can reduce a time for regular inspections and/or maintenance schedules. Moreover, through regular checks using the routine described herein, even if a component is intermittently operating, such checks are more likely to detect a failure or partial failure than a visual inspection. Furthermore, through use of a messaging system, as described herein, notifications of a failure can be immediately reported and thus a repair can be carried out in a timely and efficient manner.

The use of the terms "a," "an," "the," and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other.

Those of skill in the art will appreciate that various example embodiments are shown and described herein, each having certain features in the particular embodiments, but the present disclosure is not thus limited. That is, features of the various embodiments can be exchanged, altered, or otherwise combined in different combinations without departing from the scope of the present disclosure.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

Accordingly, the present disclosure is not to be seen as limited by the foregoing description, but is only limited by the scope of the appended claims.

What is claimed is:

1. A method of automatically checking an operational status of electrical components of an elevator system, the method comprising:
    setting a first power state of all addressed electrical components of the elevator system;
    measuring a control value power consumption with a power consumption counter;
    switching a first addressed electrical component into a second power state;
    monitoring a power consumption associated with the first addressed electrical component;
    comparing the power consumption associated with the first addressed electrical component with the control value power consumption; and
    when the power consumption associated with the first addressed electrical component is not greater than the control value power consumption, performing a detected failure operation.

2. The method of claim 1, further comprising, when the power consumption associated with the first addressed electrical component is greater than the control value power consumption, switching the first addressed electrical component to the first power state.

3. The method of claim 2, further comprising:
    switching a second addressed electrical component into the second power state;
    monitoring a power consumption associated with the second addressed electrical component; and
    comparing the power consumption associated with the second addressed electrical component with the control value power consumption.

4. The method of claim 1, wherein the detected failure operation comprises at least one of (i) storing data associated with the first addressed electrical component or (ii) generating a notification indicating that the first addressed electrical component has failed.

5. The method of claim 1, further comprising performing an elevator use check prior to setting the first power state of all addressed electrical components of the elevator system.

6. The method of claim 1, wherein the addressed electrical components comprise at least one of (i) a button of a car operating panel, (ii) a lighting fixture of an elevator car, or (iii) a display located within the elevator car.

7. The method of claim 1, wherein the first power state is an off-state of the addressed electrical components and the second power state is an on-state of the addressed electrical components.

8. The method of claim 1, wherein the addressed electrical components further comprise at least one of (i) a button of a hall or car call panel, or (ii) a display located inside the elevator car at a landing of the elevator system.

9. The method of claim 1, wherein the method is triggered by at least one of (i) a timer, (ii) a predetermined schedule, (iii) a request from a user device, or (iv) a predetermined event.

10. An elevator system comprising:
    an elevator car located within an elevator shaft; and
    a controller for automatically checking an operational status of electrical components of the elevator system, the controller configured to execute instructions comprising:
        setting a first power state of all addressed electrical components of the elevator system;
        measuring a control value power consumption with a power consumption counter;
        switching a first addressed electrical component into a second power state;
        monitoring a power consumption associated with the first addressed electrical component;
        comparing the power consumption associated with the first addressed electrical component with the control value power consumption; and
        when the power consumption associated with the first addressed electrical component is not greater than the control value power consumption, performing a detected failure operation.

11. The elevator system of claim 10 with the instructions further comprising, when the power consumption associated with the first addressed electrical component is greater than the control value power consumption, switching the first addressed electrical component to the first power state.

12. The elevator system of claim 11 with the instructions further comprising,
    switching a second addressed electrical component into the second power state;
    monitoring a power consumption associated with the second addressed electrical component; and
    comparing the power consumption associated with the second addressed electrical component with the control value power consumption.

13. The elevator system of claim 10, wherein the detected failure operation comprises at least one of (i) storing data associated with the first addressed electrical component or (ii) generating a notification indicating that the first addressed electrical component has failed.

14. The elevator system of claim 10, wherein the addressed electrical components comprise at least one of (i) a button of a hall or car call panel, or (ii) a display located inside the elevator car at a landing of the elevator system.

15. The elevator system of claim 10, wherein the power consumption counter is operably connected to a power wire of the elevator system.

* * * * *